United States Patent [19]
Frohwerk

[11] 3,978,413
[45] Aug. 31, 1976

[54] MODULUS COUNTER CIRCUIT UTILIZING SERIAL ACCESS

[75] Inventor: Robert Alan Frohwerk, San Jose, Calif.

[73] Assignee: Hewlett-Packard Company, Palo Alto, Calif.

[22] Filed: Feb. 7, 1975

[21] Appl. No.: 548,048

[52] U.S. Cl. .............................. 328/37; 307/221 R; 307/225 R; 307/226 R; 328/42; 328/45
[51] Int. Cl.² .................. G11C 19/00; H03K 23/00
[58] Field of Search .................. 328/37, 42, 45, 46, 328/48, 51; 307/221 R, 224 R, 226 R, 225 R

[56] References Cited
UNITED STATES PATENTS

| | | | |
|---|---|---|---|
| 3,056,044 | 9/1962 | Kroos | 307/221 R |
| 3,146,345 | 8/1964 | Conover, Jr. | 328/37 X |
| 3,673,390 | 6/1972 | Krebs | 307/221 R |

Primary Examiner—John Zazworsky
Attorney, Agent, or Firm—David A. Boone

[57] ABSTRACT

A circuit provides the dual functional capability of a modulus counter and a shift register, and does not require parallel access of the storage elements to preset or read the counter state.

6 Claims, 3 Drawing Figures

MODULUS COUNTER CIRCUIT UTILIZING SERIAL ACCESS

BACKGROUND AND SUMMARY OF THE INVENTION

Prior counters have often required gated parallel access to each memory element of a counter circuit to program the initial state of the counter and to read the state therefrom. If transfer of the count state to a controlling source for processing or display was required in the serial mode, a serial to parallel shift register in conjunction with the counter was sometimes required.

The present invention, by eliminating the need for parallel access to each memory element of the counter, has particular advantage where a series of concatenated counters or a single counter of any significant length is provided within a single integrated circuit package. Prior art techniques required a package pin for accessing each memory element. This usually required such a large package that it was neither practical nor economical. Therefore, several smaller packages were used instead.

The technique of the present invention allows packaging a counter circuit within a package having only the necessary power inputs, a shift input, a count input, a shift clock input, a shift output and a mode control input. Presetting and reading of the counter are accomplished in the serial mode by shifting any appropriate starting value therein.

DESCRIPTION OF THE PREFERRED EMBODIMENT

Figure 1:
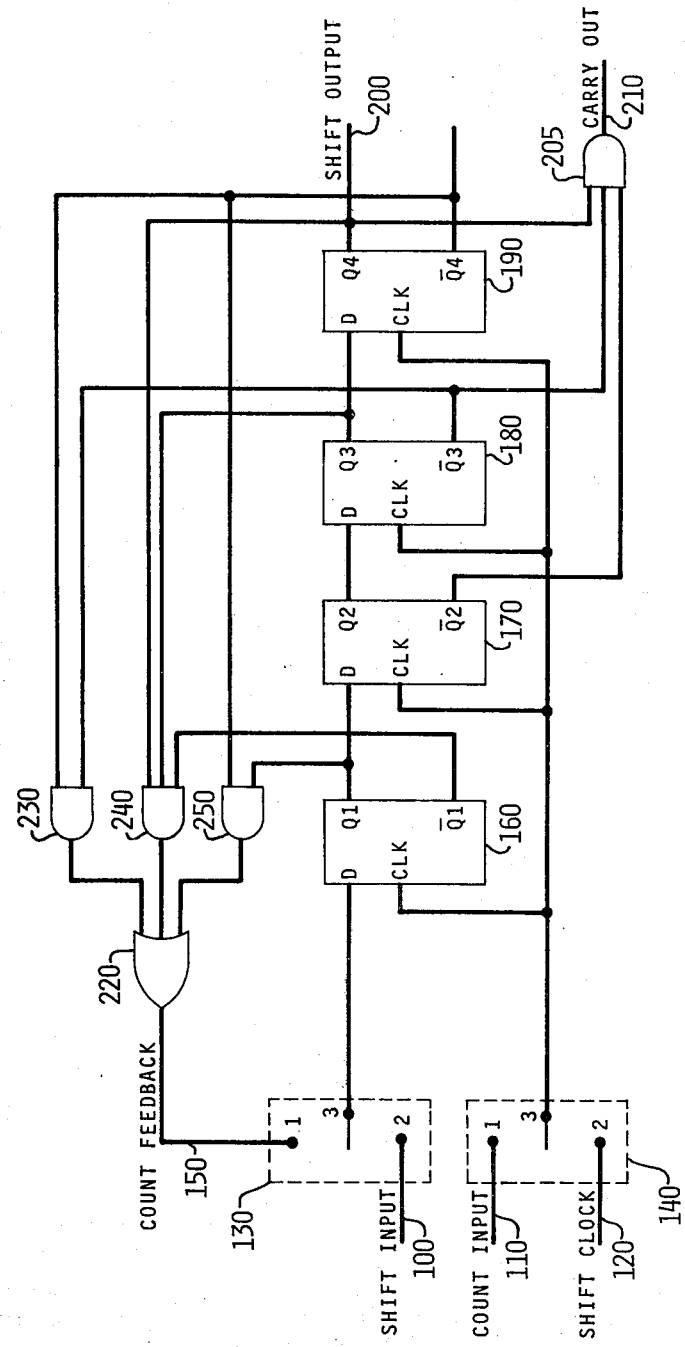
FIG. 1 is a schematic diagram of one embodiment of the invention providing a decade counter function.

Referring to FIG. 1, there is shown one embodiment of the present invention receiving a shift input 100, a count input 110, and a shift clock input 120 and providing output data on a shift output 200 and a carryout output 210. Data received on the shift input 100 is serially shifted through the bit serial shift register, flip-flops 160, 170, 180 and 190, to the shift output 200 in response to the shift clock input 120 when switch 130 is in position to couple the shift input 100 to the D input of flip-flop 160, and switch 140 is in position to couple the shift clock input 120 to the clock inputs of all the flip-flops.

The circuit shown in FIG. 1 is converted to a decade counter which cycles through the states shown in Table I whenever switch 130 is in the position to couple the count feedback 150 to the D input of flip-flop 160, and switch 140 is in the position to couple the count input 110 to the clock inputs of flip-flops 160, 170, 180 and 190. When the ninth state of the counter is reached, gate 205 provides the carryout signal 210. Carryout signal 210 may be coupled to the count input 110 of another counter to provide a second decade of counting.

Figure 2A:
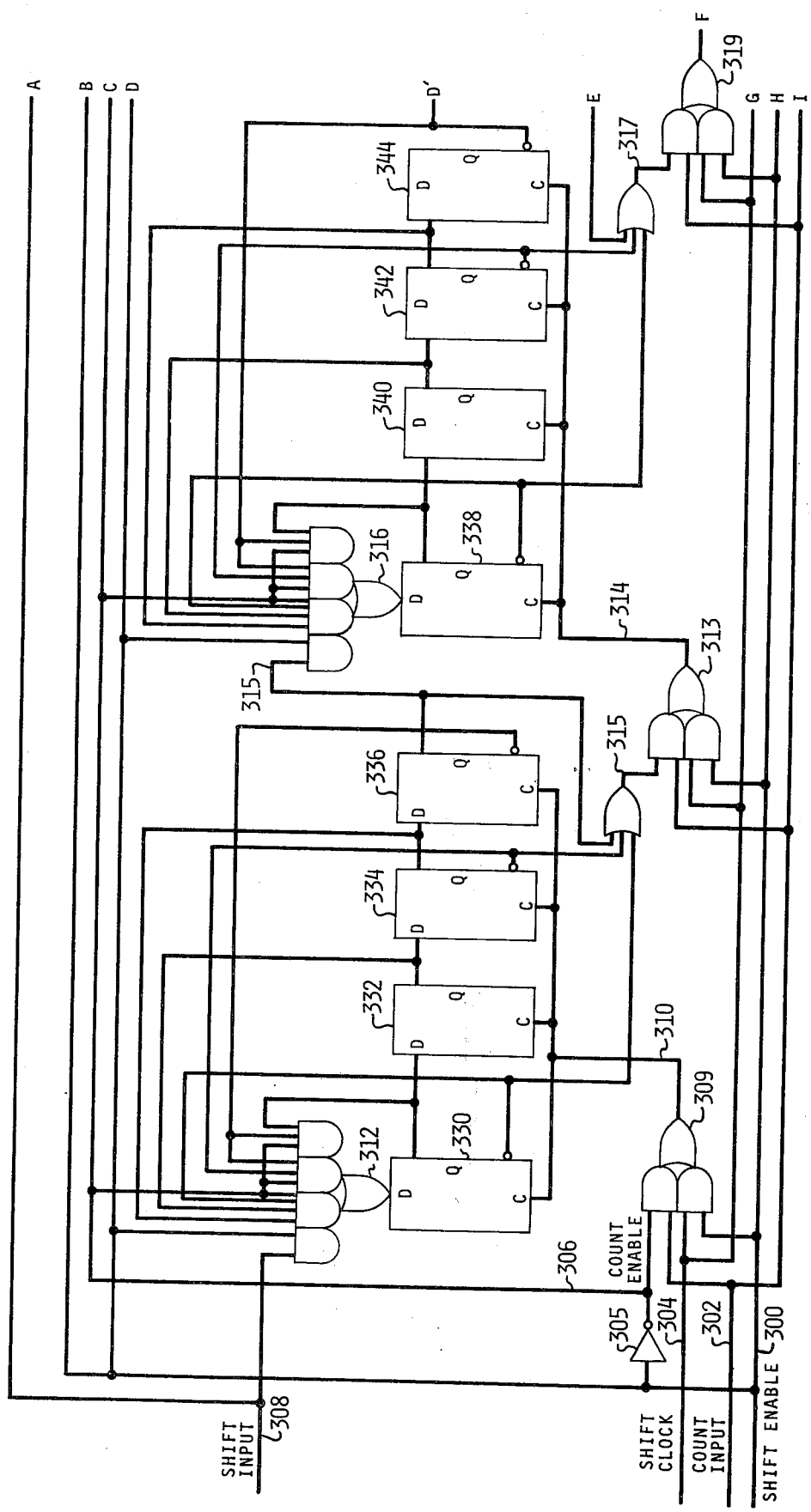
FIGS. 2A and 2B taken together are a schematic diagram of concatenated decade counters showing another embodiment of the invention.
Figure 2B:
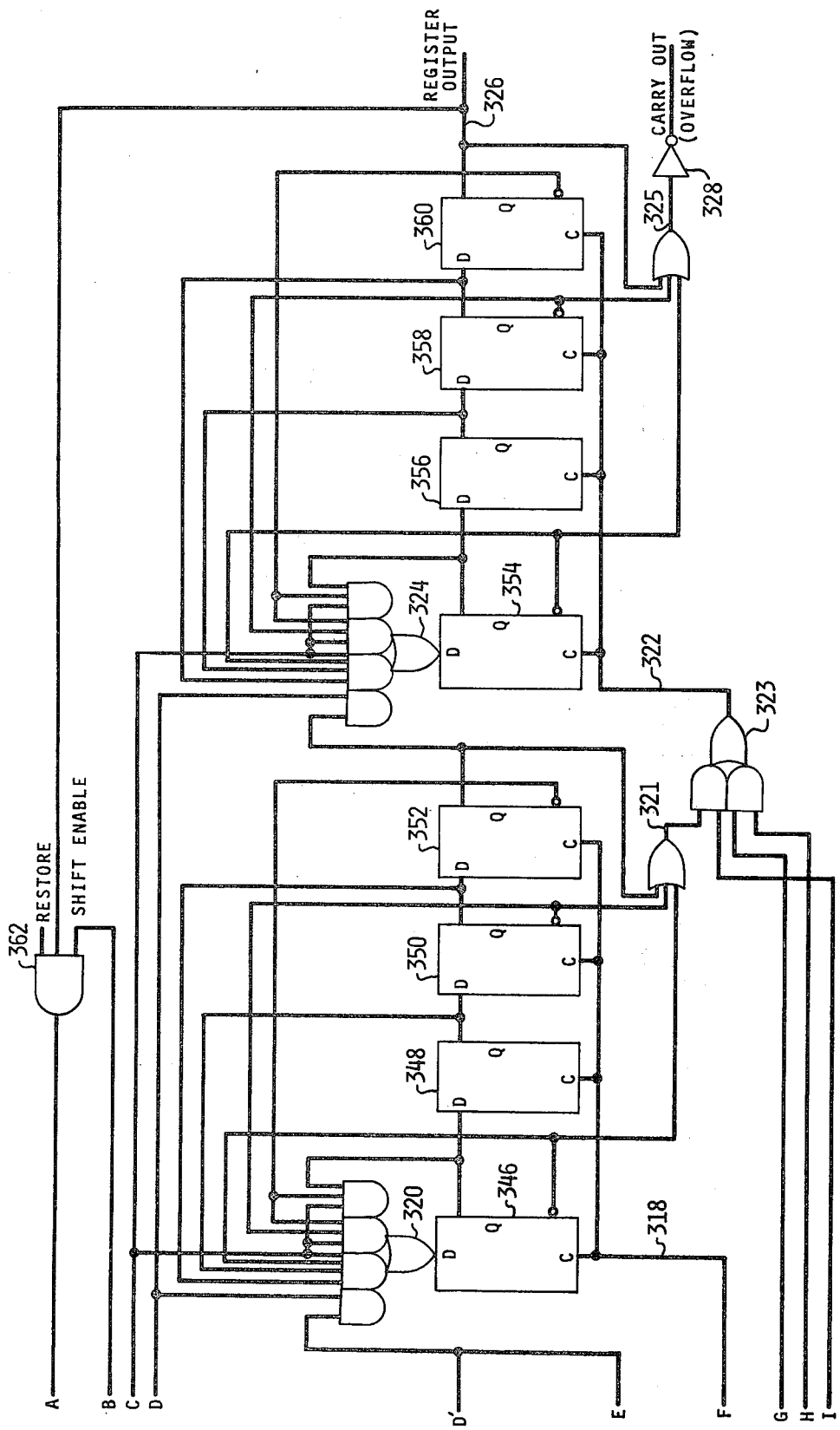

The logic gates shown in FIGS. 1, 2A, and 2B which are similar to gate 220, as shown in FIG. 1, are OR gates. Those gates similar to gates 230 and 205, as shown in FIG. 1, are AND gates. Gates similar to gate 312, shown in FIG. 2A, produce an output which is an OR function of the output of the AND gates shown immediately therebehind.

TABLE 1

| Counter State | FF 160 | FF 170 | FF 180 | FF 190 |
|---|---|---|---|---|
| 0 | 0 | 0 | 0 | 0 |
| 1 | 1 | 0 | 0 | 0 |
| 2 | 1 | 1 | 0 | 0 |
| 3 | 1 | 1 | 1 | 0 |
| 4 | 1 | 1 | 1 | 1 |
| 5 | 0 | 1 | 1 | 1 |
| 6 | 1 | 0 | 1 | 1 |
| 7 | 0 | 1 | 0 | 1 |
| 8 | 0 | 0 | 1 | 0 |
| 9 | 0 | 0 | 0 | 1 |

The feedback logic equation implemented by the circuitry shown in FIG. 1 provides the count states shown in Table I. Other feedback logic equations yield different count states. Other circuits are used to implement these feedback equations.

Referring to the schematic diagram of FIG. 2A and 2B, a circuit is shown which functions as a 16 bit shift register when signal 300 is in the true logic state, and which functions as four concatenated decade counters when signal 300 is in the false logic state. Shift register output data is provided by signal 326. Completion of the count cycle of all four decade counters is indicated by carryout signal 328.

Shifting is accomplished by applying the appropriate signals for shift input signal 308 and shift clock signal 304 while shift enable signal 300 is in the true logic state. The shift input signal 308 is then coupled through gate 312 to the input of flip-flop 330, the clock signal 310 is supplied through gate 309. Each succeeding shift clock cycle clocks the shift input 308 into flip-flop 330 while the data contained in each flip-flop is shifted to the next flip-flop. Coupling between each block of four flip-flops is enabled through gates 316, 320, and 324 by shift enable signal 300.

Counting is preceded by presetting the counter to a known state, usually either all zeros or all ones, by applying the appropriate data for shift input signal 308 and supplying shift clock signal 304 until all the flip-flops are in the desired state.

Counting of count input signal 302 is enabled when signal 306 is provided in the true state by gate 305 in response to signal 300. Signal 306 enables the count input 302 to clock flip-flops 330, 332, 334, and 336 through gate 309. Also, signal 306 enables the feedback logic through gates 312, 316, 320, and 324. The presence of the carryout signal from gate 315, 317, or 321 enables the count input to also clock the group of four flip-flops next succeeding the group of flip-flops producing the carryout signal. The carryout signal 325 from the final counting module is provided as an overflow signal through gate 328 indicating that the maximum count of the circuit, in this embodiment 9,999, has been reached. The counter state may be read at any time by toggling signal 300 to enable the shift mode and supplying the shift clock to serially provide the counter state at the register output 326.

If it is desired to continue counting from the present counter state after the read operation, the register output can be coupled via gate 362, shown in FIG. 2A, to the shift input 308, shown in FIG. 2A, thereby automatically restoring the counter state while executing the read operation. This technique is useful where count inputs are spaced at intervals great enough to enable reading and restoring of the counter state between count intervals. For example, using an embodiment of the present invention one could read the count state without interferring with the counting function simply by providing a shift clock 304 of a high enough frequency to complete the read operation between count cycles, and by providing enabling circuitry to prevent reading of the counter state while a count input is being processed.

I claim:

1. A circuit comprising:
a shift register having a clock input, a data input and a data output and a plurality of memory elements;
first circuit means coupled to the shift register for producing a feedback signal in response to selected states of the shift register;
switching means having selectable count and shift states, and having inputs for receiving a shift signal, a count signal, a shift clock signal, and a state control signal, said switching means coupled to the first circuit means for receiving said feedback signal and coupled to the shift register for applying the shift signal to said data input and the shift clock signal to said clock input when said shift state is selected, and for applying the feedback signal to said data input and the count signal to said clock input when said count state is selected, said switching means selecting said count and shift states in response to only said state control signal.

2. A circuit as in claim 1 further comprising a second circuit means coupled to said shift register for detecting a selected count state and for producing a carryout signal in response thereto.

3. A circuit as in claim 2 further comprising a gating means having an input for receiving a second control signal and being coupled to said shift register for coupling said data output to said data input in response to the second control signal.

4. A circuit as in claim 3, further comprising means for providing the shift clock signal at a frequency greater than the frequency of the count input signal by a factor which is larger than the number of memory elements in said shift register, whereby the contents of said shift register may be read out and restored between the recurrences of said count signal.

5. A circuit comprising a plurality of circuits as in claim 2, said plurality of circuits being concatenated one to the other, the carryout signal of each of said circuits being coupled to the count signal input of the next successive circuit, the shift signal being coupled to the shift signal input of the first of said circuits, wherein the carryout signal line of the last of said circuits comprises the sole user accessible data output.

6. The circuit of claim 5, further comprising gating means for coupling the carryout signal of the last of said circuits to the shift input of the first of said circuits in response to a restore-control signal.

* * * * *